United States Patent [19]

Ogiue et al.

[11] 4,009,484
[45] Feb. 22, 1977

[54] INTEGRATED CIRCUIT ISOLATION USING GOLD-DOPED POLYSILICON

[75] Inventors: Katumi Ogiue, Kodaira; Masaya Ohta; Shotaro Shibata, both of Tokyo, all of Japan

[73] Assignee: Hitachi, Ltd., Japan

[22] Filed: Dec. 3, 1969

[21] Appl. No.: 881,822

[30] Foreign Application Priority Data

Dec. 11, 1968 Japan ............... 43-90252

[52] U.S. Cl. .................. 357/59; 357/48; 357/49; 357/50; 357/64
[51] Int. Cl.[2] ............... H01L 27/04; H01L 29/04; H01L 29/167; H01L 21/20
[58] Field of Search ............ 357/48, 49, 50, 59, 357/64

[56] References Cited

UNITED STATES PATENTS 3,440,114  4/1969  Harper ..................... 148/187
3,447,235  6/1969  Rosvold et al. ........... 317/234 X
3,448,350  6/1969  Yamashita et al. ........ 317/235
3,475,661  10/1969  Iwata et al. ............... 317/234

OTHER PUBLICATIONS

Sah et al., "Effects of Multiply–Charged Gold Impurity . . . ", Applied Physics Letters, vol. 12, No. 4, 15 Feb. 1968, pp. 141–142.

Primary Examiner—William D. Larkins
Attorney, Agent, or Firm—Craig & Antonelli

[57] ABSTRACT

A semiconductor device comprising monocrystalline semiconductor regions and a polycrystalline semiconductor region doped with gold and disposed between and adjacent to the monocrystalline regions. The high impedance appearing between the regions is utilized for isolating circuit elements which are formed in the monocrystalline regions.

11 Claims, 15 Drawing Figures

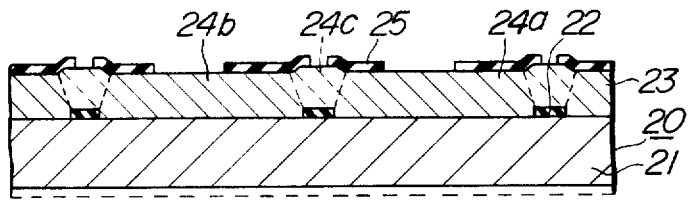
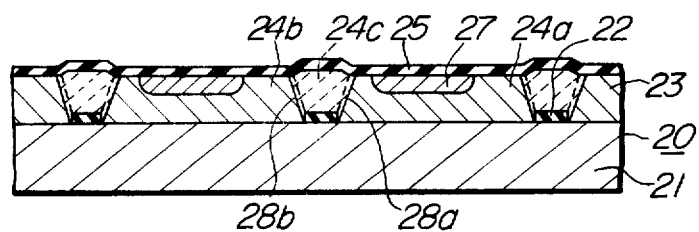
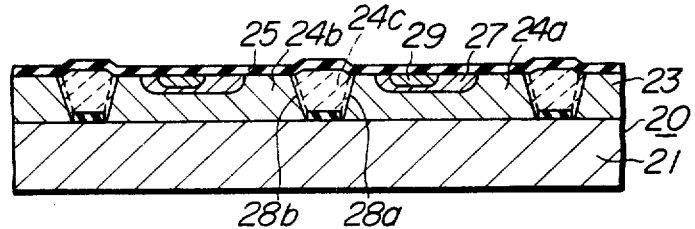
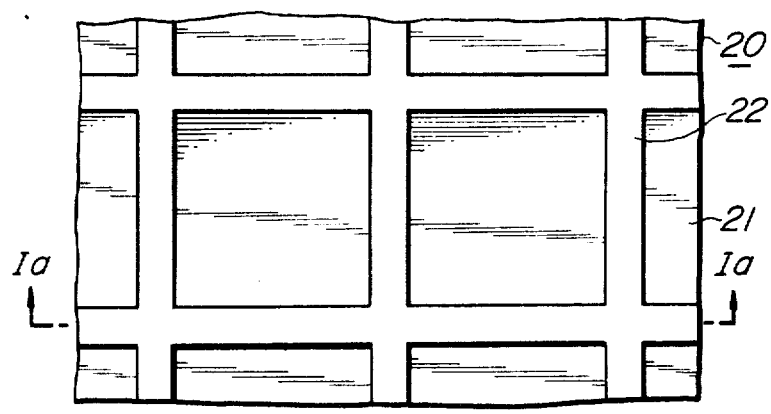

INTEGRATED CIRCUIT ISOLATION USING GOLD-DOPED POLYSILICON

This invention relates to semiconductor devices having highly resistive regions and more particularly to a semiconductor device having a plurality of electrically isolated regions formed in a unitary semiconductor body for forming circuit elements and the method for making the same.

It is well known that a PN junction formed in a semiconductor body by introducing a conductivity-type-determining impurity exhibits a high impedance under a reverse bias condition. It is also known that a voltage regulated type negative resistance element utilizing a quantum mechanical tunneling effect (often called a tunnel diode) can be provided by heavily doping impurities into a semiconductor body. Further, such elements as a PNPN element and a double base diode, which exhibit current regulated type negative resistance are also known.

In semiconductor integrated circuit devices, the manufacture of a plurality of circuit element regions unitary in a semiconductor body necessitates the isolation of each circuit element for preventing electrical interference of the other elements. One of the most basic expedients for isolating elements in a body utilizes PN junctions. More particularly, a region of a second conductivity type intervenes between the circuit elements regions of the first conductivity type. Other methods such as dielectric isolation and air gap isolation are also known.

However, these isolation methods need more than one step of selective diffusion treatment or a selective etching treatment for a semiconductor body and these treatments should be done with high precision. Thus, these methods are troublesome in practice. Further, isolation regions for isolating circuit elements require a large area, thus decreasing the integration density and the utility of a semiconductor body. They also have a drawback in that manufacturing costs become high due to the complex manufacturing processes. An object of the invention is to provide a high impedance device. Another object of the invention is to provide an improvement in isolation techniques.

Yet another object of the invention is to provide an electric current regulated type negative resistance device.

Still another object of the invention is to provide a semiconductor integrated circuit device including a plurality of circuit elements formed integrally in a semiconductor body at a high density and a method of making the same.

According to an embodiment of the invention, a semiconductor device is made by forming monocrystalline and polycrystalline regions of a second conductivity type on a body of a first conductivity type semiconductor or insulator having a partially formed film of silicon oxide or the like and introducing a deep-level-forming impurity such as gold or a mixture of such an impurity and a shallow-level-forming impurity that determines the first conductivity type. The features and advantages of the present invention will be more apparent from the following description with reference to the accompanying drawings in which:

FIGS. 2a to 2c show in cross-section how a semiconductor wafer would appear in various manufacturing steps of a semiconductor integrated circuit of another embodiment of the invention;

FIG. 3 is a top plan view of the semiconductor wafer, the cross section of which is shown in FIG. 1a taken along line 1a—1a of FIG. 3;

Figure 6:
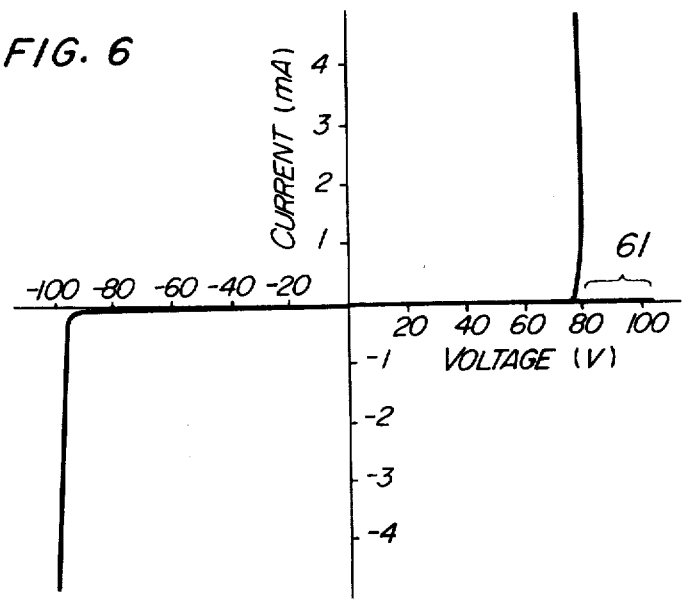
Figure 7:
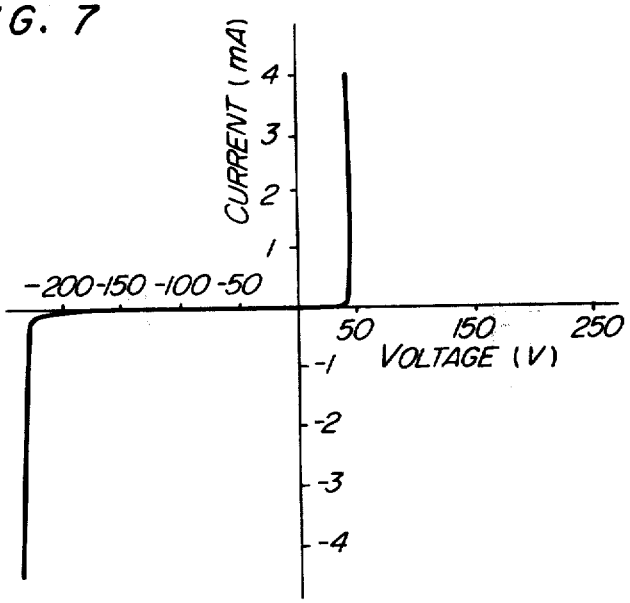
Figure 8:
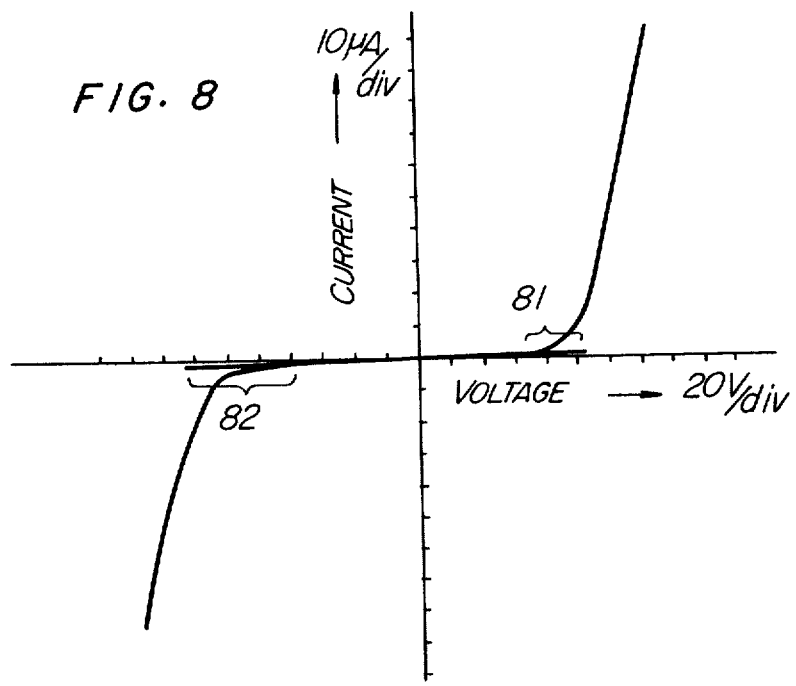
Figure 9:
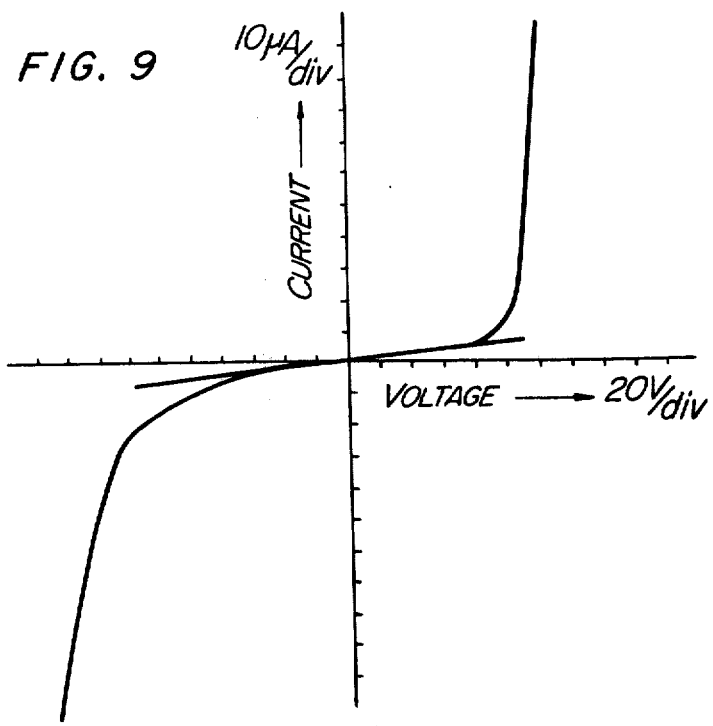

FIGS. 6 and 7 are voltage vs. current characteristic curves of semiconductor integrated circuits of other embodiments according to the invention; and FIGS. 8 and 9 are voltage vs. current characteristic curves of semiconductor devices comprising a monocrystalline semiconductor region and an adjacent polycrystalline semiconductor region including gold of further embodiments according to the invention.

Figure 5:
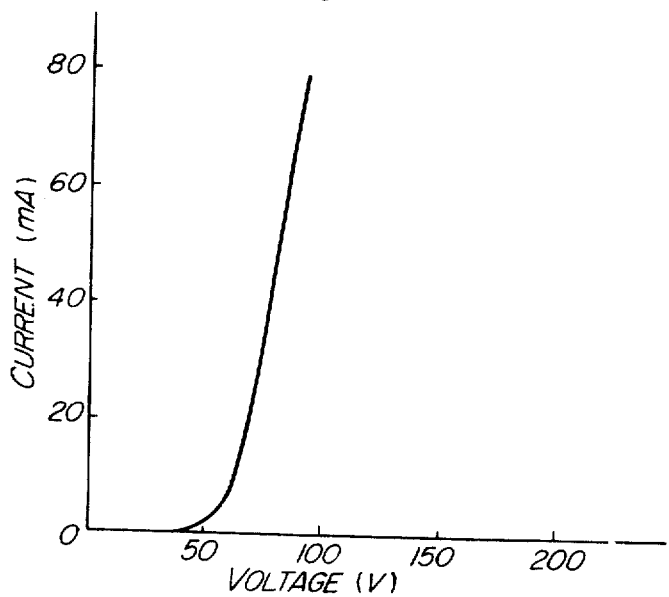
FIG. 5 is a voltage vs. current characteristic curve of a reversely biased PN junction.

In order to solve the problems occurring at the isolation of semiconductor regions in the integrated circuit, a method has been proposed, in the copending U.S. patent application Ser. No. 662,646, entitled "MANUFACTURE OF SEMICONDUCTOR DEVICE" by Katsumi Ogiue, and assigned to the assignee of the instant Application, now U.S. Pat. No. 3,791,882, for separating an epitaxial region into a plurality of regions, utilizing the fact that when an epitaxial monocrystal is grown on a semiconductor body partially covered with a silicon oxide film, a polycrystal grows on this silicon oxide film and that the diffusion velocity of an impurity in such a polycrystal is much larger than that of a monocrystal, and comprising the step of introducing an impurity of an opposite conductivity type to that of such epitaxial monocrystal into such polycrystalline regions. In this case, a PN junction was formed at such a location in the monocrystalline region that is in the neighborhood of the polycrystalline region. This PN junction showed the voltage vs. current curve of FIG. 5 under conditions of negative biasing. As a result of further research, the present inventors have found that a higher resistance, a higher breakdown voltage and a voltage regulated type negative resistance can be obtained between a monocrystalline region and an adjacent polycrystalline region by introducing only a deep-level-forming impurity such as gold into the polycrystalline region and that a further higher breakdown voltage can be obtained by introducing a conductivity-type-determining impurity into the polycrystalline region doped with a deep-level-forming impurity such as gold. Various embodiments of the invention are based on this finding.

EMBODIMENT I

Figure 1A:
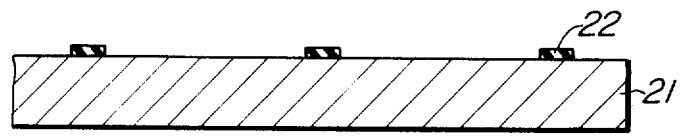
FIGS. 1a to 1e show in cross-section how a semiconductor wafer would appear in various manufacturing steps of an embodiment of the invention.

FIGS. 1a to 1e show a typical example of the manufacturing steps of a semiconductor device of the invention. Firstly, a silicon oxide film 22 is formed in a lattice shape on a principal surface lying in a (111) crystal plane of a semiconductor substrate 21 which is made, for example, of a P type silicon substrate of 200 $\mu$ thickness and having a specific resistance of 10$\Omega$-cm, as is shown in FIG. 1a, FIG. 3 shows a top plan view of this wafer. This silicon oxide film 22 has a thickness of 0.7 $\mu$ and a width of 20 $\mu$ and is formed in a lattice shape enclosing squares having sides of 124 $\mu$.

Figure 1B:
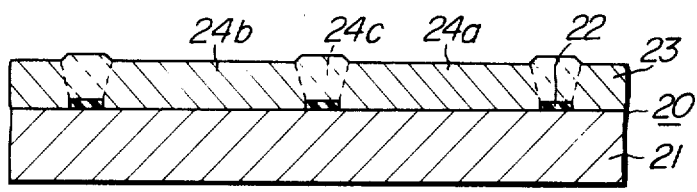
Figure 4:
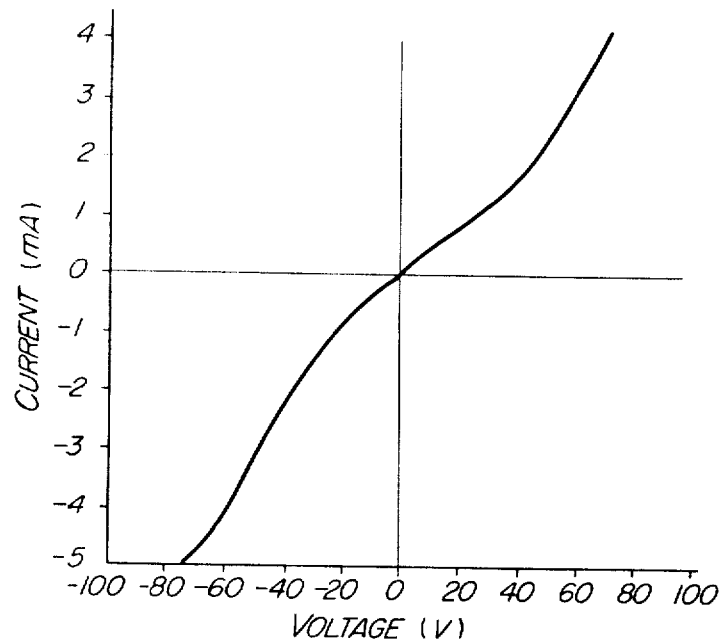
FIG. 4 is a voltage vs. current characteristic curve detected between a monocrystalline silicon region and an adjacent polycrystalline silicon region.

Next, an epitaxial layer 23 is formed on the substrate 21, as is shown in FIG. 1b. In this step, the substrate 21 was heated to a temperature of 1200° C for 10 minutes to form an epitaxial silicon layer 23 having a thickness of about 10 μ by the thermal decomposition of monosilane. The epitaxial layer 23 was given an impurity of phosphorous to have an N type conductivity of a specific resistance 1Ω-cm. The epitaxial layer 23 included monocrystalline silicon regions 24a and 24b grown directly on the monocrystalline silicon substrate 21, and a polycrystalline region 24c grown on the silicon oxide film 22. When the voltage-current characteristic was measured between a monocrystalline silicon region 24a and the adjacent polycrystalline region 24c, it showed the characteristic shown in FIG. 4 in most parts of the polycrystalline region and there was found no high impedance.

Figure 1C:
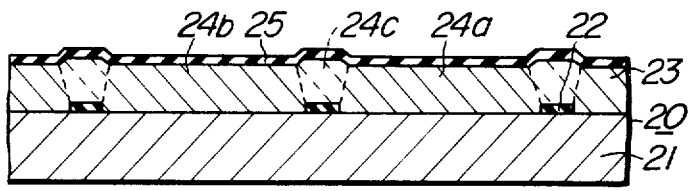
Figure 1D:
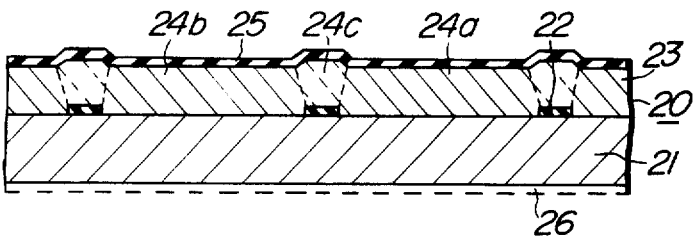

Then, a silicon oxide film 25 was formed on the surface of the epitaxial layer 23, as is shown in FIG. 1c. Namely, the substrate 21 and the epitaxial layer 23 (these two will be referred to as substrate 20, hereinafter) are heated to a temperature of 1200° C to form a thermally generated oxide film 25 of a thickness of 1 μ thick on the epitaxial layer 23.

Then, gold was deposited on the other principal surface of the substrate 21 to a thickness of 5000 A and the substrate 20 was heated to a temperature of 900° to 1200° C and should preferably be heated to 1200° C for 40 minutes to diffuse the gold into the substrate 20. In this step, gold is preferably introduced at a concentration of about $10^{14}$ to $10^{16}$ atoms/cc.

Figure 1E:
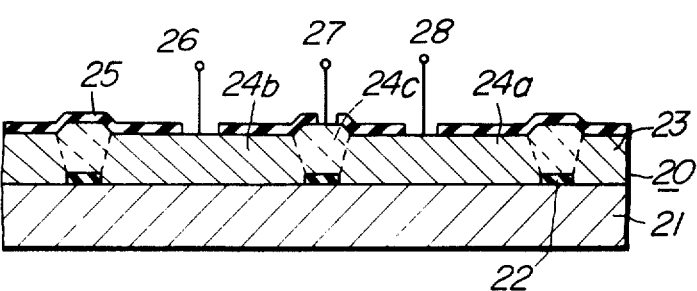

When the voltage vs. current characteristic between the monocrystalline regions 24a, 24b and the polycrystalline region 24c, i.e. between the terminals 26, 28 and 27 of the device of FIG. 1e were measured with a curve tracer, a high resistance and a high breakdown voltage of about 100 V were detected under the application of a positive voltage to the N type monocrystalline region 24a or 24b, as is shown in the third quadrant of FIG. 6. When the polarity of the applied voltage was reversed, this voltage-current characteristic also showed a high resistance and a breakdown voltage of about 80 V, as is shown in the first quadrant of FIG. 6, thus showing a negative resistance (cf. portion 61, this fact will be more clearly described in connection with FIGS. 8 and 9). This characteristic has roughly similar features for both directions and a high resistance for roughly similar features for both directions and a high resistance for both directions indicates tha the polycrystalline region and the monocrystal region are isolated, regardless of the direction of the bias.

Thus, the polycrystalline regiong 24c practically works as a high resistance region to electrically isolate the monocrystal regions 24a and 24b from each other. Respective circuit elements such as transistors can be formed in these isolated monocrystal regions 24a and 24b.

EMBODIMENT II

Another embodiment of the manufacure of a semiconductor device of the invention is shown in FIGS. 2a to 2c in which like reference numerals indicate like parts. First, treatments shown in FIGS. 1a to 1c were carried out on a semiconductor substrate 21.

Then, the silicon oxide film 25 was partially removed to expose the surface of the epitaxial layer 23, as is shown in FIG. 2a. And, boron was deposited on the exposed surface of the epitaxial layer 23 at a temperature of 950° C for 35 minutes. Then a gold deposition layer 26 of a thickness 5000 A was formed on the other principal surface of the substrate 21.

Next, the substrate 20 was heated to a temperature of 1200° C for 40 minutes to simultaneously diffuse the deposited boron and gold into the substrate 20. Since gold has a very large diffusion coefficient in silicon, it diffused into the whole substrate. But, boron only diffused into the portion where the silicon oxide film 25 was removed and in its neighborhood to a depth of 3 μ.

Nevertheless, boron has a greater diffusion velocity in a polycrystal so that it diffused into the whole polycrystal region 24c and further into the monocrystal regions 24a and 24b to form the respective PN junctions 28a and 28b whereas the P type region 27 (surface density = $5 \times 10^{18}$ atoms/cm$^2$) formed by the diffusion of boron into the monocrystalline regions 24a and 24b had a diffusion depth of only 3 μ.

When the voltage vs. current characteristic between the monocrystalline regions 24a, 24b and the polycrystalline region 24c (which was given a P type tendency by the diffusion of boron) was measured with a curve tracer under this condition, it showed the curve of FIG. 7. Thus it was found that the forward breakdown voltage was about 50 V and the reverse breakdown voltage was about 230 V.

Next, phosphorus was selectively diffused into the P type region 27 (base) diffused with boron to obtain an N type emitter region. Thus, NPN transistors were formed in the monocrystalline regions 24a and 24b isolated by a polycrystalline region 24c. No large resistance was detected between the polycrystal region 24c including a donor impurity and formed on the silicon oxide film 22 and the monocrystalline region 24a being adjacent thereto, but a large resistance appeared when gold was diffused into the substrate 20. Further the reverse breakdown voltage was extraordinarily increased by the diffusion of boron into the polycrystalline region 24. In cases where acceptor impurities were diffused into a polycrystalline region, negative resistance was detected neither in the forward direction nor in the reverse direction.

An advantage of the foregoing separation technique lies in that the electrical isolation of the respective circuit elements can be done simultaneously with the diffusion of a deep-level forming impurity, such as gold, working as a lifetime killer to decrease the minority carrier storage effect in the case of a logic circuit (for example, a transistor-transistor logic circuit). This makes the diffusion treatment (isolation diffusion) of a conductivity-type-determining impurity for isolation required in the conventional technique unnecessary in order to enhance the mass-production of an integrated logic circuit.

FIG. 8 shows the voltage vs. current characteristic detected at the terminals 26 and 28 of the device of the first embodiment shown in FIG. 1e. As is apparent from this figure, it is noted between these terminals 26 and 28 that a high resistance appears, that a current regulated type negative resistance appears (cf. portions 81 and 82) and that these high resistances and negative resistances appear in both directions. The existence of high resistance indicates that the regions 24a and 24b are substantially electrically isolated. The negative resistance can be utilized for the formation of a generator. And the high resistance in both direction indicates that regions 24a and 24b are isolated regardless of the direction of the biasing. This can be compared to conventional isolation with a PN junction in which only one direction of biasing is permitted.

FIG. 9 shows the voltage vs. current characteristic of another embodiment similar to the first embodiment but modified in that the steps of FIGS. 1a to 1e are done on a substrate having a principal surface of a crystal surface orientation (100) and that an epitaxial layer 23 is grown at a temperature within the range of 900°~1000° C for 30 minutes. Similar to the case of FIG. 8, this characteristic is detected at terminals provided on the adjacent monocrystalline regions with a polycrystalline region therebetween. A high resistance and a negative resistance are detected in both directions similar to the case of FIG. 8. Further, a polycrystalline region growing on a silicon oxide film has a slightly increasing dimension as the distance from the oxide film increases. For example, when a silicon oxide film 22 has a width of 20 $\mu$, the width of the top surface of the polycrystalline region 24c becomes 25 to 30 $\mu$ in the first embodiment and 20 to 21 $\mu$ in the case of the (100) crystal surface. In addition, the narrow width of the polycrystalline isolation region 24c, e.g. 5 $\mu$ can be defined when the width of the silicon oxide film 22 is about 5 $\mu$. According to the conventional isolation technique with a PN junction or etching treatment, a width of at least 20 $\mu$ is needed for an isolating region. Thus, the width of an isolating region needed in this invention is much smaller than the conventional one and this invention is very effective in increasing the integration density. In particular, the surface orientation of (100) is very effective for improvement of the integration density.

Since the reverse breakdown voltage between the substrate and a monocrystalline region is about 300 V, it is considered that the characteristic curves shown in FIGS. 8 and 9 show the reverse breakdown voltage between a monocrystalline and a polycrystalline region.

Further, breakdown characteristics shown in FIGS. 6, 7, 8 and 9 have a recovery potential and it has been confirmed that a thermal breakdown does not occur at a flow of current of about 200 to 300 mA. The reason for the occurrence of high resistance is considered to be that gold concentrates in the polycrystalline region 24 to cause the latter to act as a high resistance region.

Namely, gold acts as both an acceptor and a donor impurity and very sensitively reacts with both N and P types, since the acceptor level lies 0.54 eV under the conduction band and the donor level lies 0.35 eV above the occupied or filled level.

Thus, the Fermi level of an N type silicon crystal only doped with a shallow-level N type impurity such as phosphorus locates near the bottom of the conduction band under normal temperatures. When gold is further doped into the silicon crystal, free electrons fall into the acceptor level of gold and the number of free electrons excited to the conduction band decreases. When the gold trap concentration becomes equal to the shallow-level donor concentration, the density of free electrons rapidly decreases to increase the resistance as the Fermi level approaches the intrinsic Fermi level. When gold is further heavily doped, the concentration of free electrons keeps on decreasing and the Fermi level settles under the intrinsic Fermi level. The resistance shows the maximum value when the electrons and holes distribute in such a manner that $n\mu_e = p\mu_h$ ($n$: number of electrons, $p$: number of holes, $\mu_e$: mobility of an electron, and $\mu_h$: mobility of a hole). When gold is yet further doped, the N type silicon transforms into a P type and the resistance decreases to the value determined when gold is the dominant impurity. It will be understood from the foregoing that when the deposited epitaxial layer is an N type the concentration of doped gold is preferably equal to or above the concentration of an N type impurity in the polycrystalline region. Since gold has a remarkably large diffusion velocity in a polycrystalline region than in a monocrystalline region and tends to segregate, it concentrates in th polycrystalline region to impart an influence, particularly to the polycrystalline region. Therefore, the doping of gold need not be done selectively to the polycrystalline region but may be done from the whole bottom surface of the semiconductor substrate or from the whole surface from vapor.

Though only gold is examplified in the foregoing embodiments, zinc, iron, copper, nickel, etc. which may form a deep level in a semiconductor can equally be used.

Further, if boron is doped into the polycrystalline regions as is the case with the second embodiment, PN junctions are formed in the polycrystalline regions 24c or in the monocrystalline regions 24a and 24b in the neighborhood of the polycrystalline region 24c. These PN junctions are considered to contribute to the increase the breakdown voltage with the effect of gold doping.

As the shallow-level-forming conductivity-type-determining impurity which forms a PN junction, gallium, etc. can be used as well as boron as a P type impurity and phosphorus, arsenic, antimony, etc. can be used for an N type impurity.

Further, materials such as silicon nitride, aluminum oxide, etc. on which a semiconductor does now grow in monocrystal form can also be used as the insulating film 22 as well as silicon oxide. The thickness, width and other dimensions of the insulating film can also be appropriately changed. Further, for the formation of a polycrystalline layer, other methods for forming seeds for polycrystal can also be employed. For example, the surface of a monocrystal may be partially subjected to sand-blasting. The substrate 21 need not be a semiconductor but may be an insulating material such as sapphire if a monocrystalline semiconductor grows epitaxially thereon. According to another example, monocrystal and polycrystal regions are first formed on a substrate and then an insulating material such as glass is thickly coated thereon and finally the first substrate is removed to use the insulating material as a support substrte.

What is claimed is:
1. A semiconductor device comprising:
   a monocrystalline semiconductor region; and
   a polycrystalline semiconductor region being directly contiguous to said monocrystal region and doped with an impurity forming a deep level therein;
   in which said monocrystalline region is doped with a first conductivity-type-determining impurity and gold, and said polycrystalline region is doped with gold and a second conductivity-type determining impurity.
2. A semiconductor device comprising:
   a monocrystalline semiconductor substrate having a principal surface;
   a monocrystalline semiconductor layer epitaxially grown on said principal surface;

a polycrystalline semiconductor layer formed on said principal surface of the semiconductor substrate directly contiguous to and enclosing said monocrystalline layer and distributed with a deep-level-forming impurity; and an insulating film between sad polycrystalline semiconductor layer and said semiconductor substrate.

3. A semiconductor device comprising:
a monocyrstalline semiconductor substrate having a principal surface;
a monocrystalline semiconductor layer epitaxially grown on said prinicipal surface;
a polycrystalline semiconductor layer formed on said principal surface of the semiconductor substrate directly contiguous to and enclosing said monocrystalline layer and distributed with a deep-level-forming impurity; and
in which said monocrystalline semiconductor substrate includes a first conductivity-type-determining impurity, said monocrystalline and polycrystalline semiconductor layers are doped with a second conductivity-type determining impurity, and said polycrystalline layer includes gold with a concentration not less than that of said second conductivity-type-determining impurity.

4. A semiconductor device according to claim 2, in which said substrate monocrystalline layer and polycrystalline layer consist essentially of silicon, said insulating layer is formed of at least one material selected from the group consisting of silicon oxide, silicon nitride and aluminum oxide, and the said deep-level-forming impurity is gold.

5. A semiconductor device according to claim 3, in which said polycrystalline semiconductor layer is further layer doped with said first conductivity-type-determining impurity.

6. A semiconductor device according to claim 4, in which the concentration of gold is $10^{14}$ to $10^{15}$ atoms/cc.

7. A semiconductor integrated circuit device comprising a semiconductor monocrystalline substrate, a plurality of monocrystalline semiconductor layers formed on the surface of said substrate, each of said monocrystalline semiconductor layers having at least one semiconductor circuit element therein, and a plurality of polycrystalline semiconductor layers formed on the surface of said substrate between said plurality of monocrystalline semiconductor layers so as to surround said plurality of monocrystalline semiconductor layers, said plurality of polycrystalline layers including gold and a shallow level impurity.

8. A semiconductor integrated circuit device according to claim 7, wherein the surface of said semiconductor substrate is oriented to a (100) crystal plane.

9. A semiconductor device comprising:
a monocrystalline semiconductor substrate having a principal surface, a monocrystalline semiconductor layer is selective areas on said principal surface, a polycrystalline semiconductor layer on said principal surface directly contiguous to and enclosing said monocrystalline layer, a deep-level forming impurity being distributed through said polycrystalline semiconductor layer to improve the electrical characteristics of the semiconductor device as regards isolation, wherein said deep-level-forming impurity is selected from the group consisting of gold, zinc, iron, copper and nickel, and
wherein said monocrystalline layer includes a region containing a first conductivity-type-determining impurity and said polycrystalline layer contains, in addition to the deep-level-forming impurity, a second conductivity-type-determining impurity opposite to said first conductivity-type-determining impurity.

10. A semiconductor device comprising a monocrystalline semiconductor substrate having a principal surface, aamonocrystalline semicoductor layer in selective areas on said principal surface, a polycrystalline semiconductor layer on said principal surface directly contiguous to and enclosing said monocrystalline layer, a deep-level-forming impurity being distributed through said polycrystalline semiconductor layer to improve the electrical characteristics of the semiconductor device as regards isolation, and wherein said deep-level-forming impurity is gold with a concentration of about $10^{14}$ to $10^{15}$ atoms/cc.

11. A semiconductor device according to claim 10, wherein said monocrystalline semiconductor layer is provided with a first conductivity-type-determining impurity forming a region therein and said polycrystalline region contains a second conductivity-type-determining impurity opposite to said first conductivity type determining impurity.

* * * * *